(12) United States Patent
Cheng et al.

(10) Patent No.: US 10,453,843 B2
(45) Date of Patent: Oct. 22, 2019

(54) MULTIPLE FINFET FORMATION WITH EPITAXY SEPARATION

(71) Applicant: International Business Machines Corporation, Armonk, NY (US)

(72) Inventors: Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 15/617,001

(22) Filed: Jun. 8, 2017

(65) Prior Publication Data

US 2018/0090496 A1 Mar. 29, 2018

Related U.S. Application Data

(62) Division of application No. 15/274,269, filed on Sep. 23, 2016, now Pat. No. 9,748,245.

(51) Int. Cl.
| | |
|---|---|
| *H01L 27/092* | (2006.01) |
| *H01L 21/8234* | (2006.01) |
| *H01L 21/3065* | (2006.01) |
| *H01L 21/308* | (2006.01) |
| *H01L 21/3105* | (2006.01) |
| *H01L 27/088* | (2006.01) |

(Continued)

(52) U.S. Cl.
CPC ...... *H01L 27/0924* (2013.01); *H01L 21/3065* (2013.01); *H01L 21/3081* (2013.01); *H01L 21/31051* (2013.01); *H01L 21/823418* (2013.01); *H01L 21/823431* (2013.01); *H01L 21/823475* (2013.01); *H01L 21/823481* (2013.01); *H01L 21/823814* (2013.01); *H01L 21/823821* (2013.01); *H01L 21/823878* (2013.01); *H01L 27/0886* (2013.01); *H01L 27/1104* (2013.01); *H01L 29/0653* (2013.01); *H01L 29/41791* (2013.01); *H01L 29/6681* (2013.01); *H01L 21/823871* (2013.01); *H01L 29/785* (2013.01)

(58) Field of Classification Search
CPC .. H01L 27/11; H01L 27/1104; H01L 21/1211; H01L 29/785
USPC ........................................................ 257/370
See application file for complete search history.

(56) References Cited

U.S. PATENT DOCUMENTS

| | | | | |
|---|---|---|---|---|
| 9,805,989 | B1 * | 10/2017 | Adusumilli | ..... H01L 21/823814 |
| 2009/0267155 | A1 * | 10/2009 | Izumida | .............. H01L 29/1054 257/365 |

(Continued)

OTHER PUBLICATIONS

Kangguo Cheng et al., "Multiple FinFET Formation With Epitaxy Separation", U.S. Appl. No. 15/274,269, filed Sep. 23, 2016.

(Continued)

*Primary Examiner* — Nilufa Rahim
(74) *Attorney, Agent, or Firm* — Cantor Colburn LLP; Vazken Alexanian

(57) ABSTRACT

A semiconductor device including an nFET device and pFET device adjacent one another. The semiconductor device includes a shallow trench isolator (STI), a gate and a substrate having fins extending upwardly through the STI. The fins include: nFET fins disposed in an nFET epi well formed in the STI and disposed in a pFET epi well formed in the STI, a top the STI being above a top of the fins.

16 Claims, 14 Drawing Sheets

(51) Int. Cl.
*H01L 27/11* (2006.01)
*H01L 21/8238* (2006.01)
*H01L 29/06* (2006.01)
*H01L 29/417* (2006.01)
*H01L 29/66* (2006.01)
*H01L 29/78* (2006.01)

(56) References Cited

U.S. PATENT DOCUMENTS

| | | | | |
|---|---|---|---|---|
| 2014/0191325 A1* | 7/2014 | Chowdhury | ........ | H01L 27/0924 257/369 |
| 2015/0228671 A1* | 8/2015 | Adam | ............ | H01L 21/823821 257/351 |
| 2016/0204194 A1* | 7/2016 | Cheng | ................ | H01L 27/0886 257/401 |
| 2017/0148877 A1* | 5/2017 | Jung | ................... | H01L 29/0847 |
| 2018/0026118 A1* | 1/2018 | Breil | ................ | H01L 29/66795 |

OTHER PUBLICATIONS

List of IBM Patents or Patent Applications Treated as Related; (Appendix P), filed Jun. 8, 2017; 2 pages.

* cited by examiner

MULTIPLE FINFET FORMATION WITH EPITAXY SEPARATION

DOMESTIC PRIORITY

This application is a divisional of U.S. patent application Ser. No. 15/274,269, filed Sep. 23, 2016, the disclosure of which is incorporated by reference herein in its entirety.

BACKGROUND

The present invention relates in general to semiconductor device fabrication methods and resulting structures. More specifically, the present invention relates to fabrication methods and resulting structures for a semiconductor having multiple fin field effect transistors (finFETs) where epitaxially grown source and drain regions of the finFETs are separated from each other.

In contemporary semiconductor device fabrication processes, a large number of semiconductor devices, such as fin field effect transistors (finFETs), are fabricated in and on a single wafer. FinFETs employ semiconductor fins to introduce on-wafer topography. The semiconductor fins are often formed as an array of semiconductor fins having a periodicity, or fin pitch, to minimize etch bias due to pattern factor, i.e., the fraction of the area of the semiconductor fins within a unit area. In this case, some of the semiconductor fins need to be made with a smaller fin pitch as the size of complementary metal-oxide-semiconductor (CMOS) devices become smaller. For example, consider a static random-access memory that includes closely spaced pFET and nFET pair. As the density increases, the possibility of shorting occurring during a late stage epitaxy step increases. Such a step could include, for example, an epitaxy step that allows for connection of a metal contact to one or more fins of the pFET and/or nFET. A method of avoiding such shorting would be well received in the industry.

SUMMARY

According to one or more embodiments of the present invention, a method for forming a semiconductor device is described. The method includes forming a plurality of fins from a substrate, removing at least one fin to form at least a first group of fins having at least two fins and a second group of fins having at least one fin and filling space between the fins with a shallow trench isolator (STI). The method also includes lowering a top of the STI to reveal the first and second groups of fins, forming a nitride spacer layer over the STI and the first and second groups of fins, the nitride spacer layer having thickness equal to a fin distance between adjacent fins in the first group, removing the nitride spacer layer that is further than the fin distance away from outer fins of the first group and an outer fin of the second group, filling the spaces between remaining portions of the nitride spacer layer with more of the STI and removing the remaining portions of the nitride spacer layer to form first and second epi wells separated by a barrier formed by the STI. The method also includes forming a gate over the first and second groups of fins, epitaxially growing source and drain contacts on either side of the gate in the first epi well and epitaxially growing source and drain contacts on either side of the gate in the second epi well. The barrier prevents the epitaxially grown source and drain contacts in the first epi well from contacting the epitaxially grown source and drain contacts in the second epi well.

Also described is a method for forming an SRAM device including an nFET and a pFET adjacent to one another. The method includes: forming a plurality of fins from a substrate; removing at least one fin to form at least an nFET group of fins having at least two fins and a pFET group of fins having at least one fin; filling space between the fins with a shallow trench isolator (STI); lowering a top of the STI to reveal the nFET and pFET groups of fins; forming a nitride spacer layer over the STI and the nFET and pFET groups of fins, the nitride spacer layer having thickness equal to a fin distance between adjacent fins in the nFET group; removing the nitride spacer layer that is further than the fin distance away from outer fins of the nFET group; filling the spaces between remaining portions of the nitride spacer layer with more of the STI; removing the remaining portions of the nitride spacer layer to form first and second epi wells separated by a barrier formed by the STI; forming a gate over the nFET and pFET groups of fins; epitaxially growing source and drain contacts on either side of the gate in the first epi well; and epitaxially growing source and drain contacts on either side of the gate in the second epi well. In this method, the barrier prevents the epitaxially grown source and drain contacts in the first epi well from contacting the epitaxially grown source and drain contacts in the second epi well.

Also described is a semiconductor device including an nFET device and pFET device adjacent one another. The semiconductor device includes a shallow trench isolator (STI), a gate and a substrate having fins extending upwardly through the STI. The fins include: nFET fins extending outwardly from opposing sides of the gate and disposed in an nFET epi well formed in the STI, a top the STI being above a top of the nFET fins; and pFET fins extending outwardly from opposing sides of the gate and disposed in a pFET epi well formed in the STI, a top the STI being above a top of the pFET fins, wherein the pFET epi well is separated from the nFET epi well by a barrier formed by a portion of the STI. The device also includes nFET source contacts on each nFET fin, each nFET source contact on each nFET source contact being in physical contact with an nFET source contact of an adjacent nFET fin.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
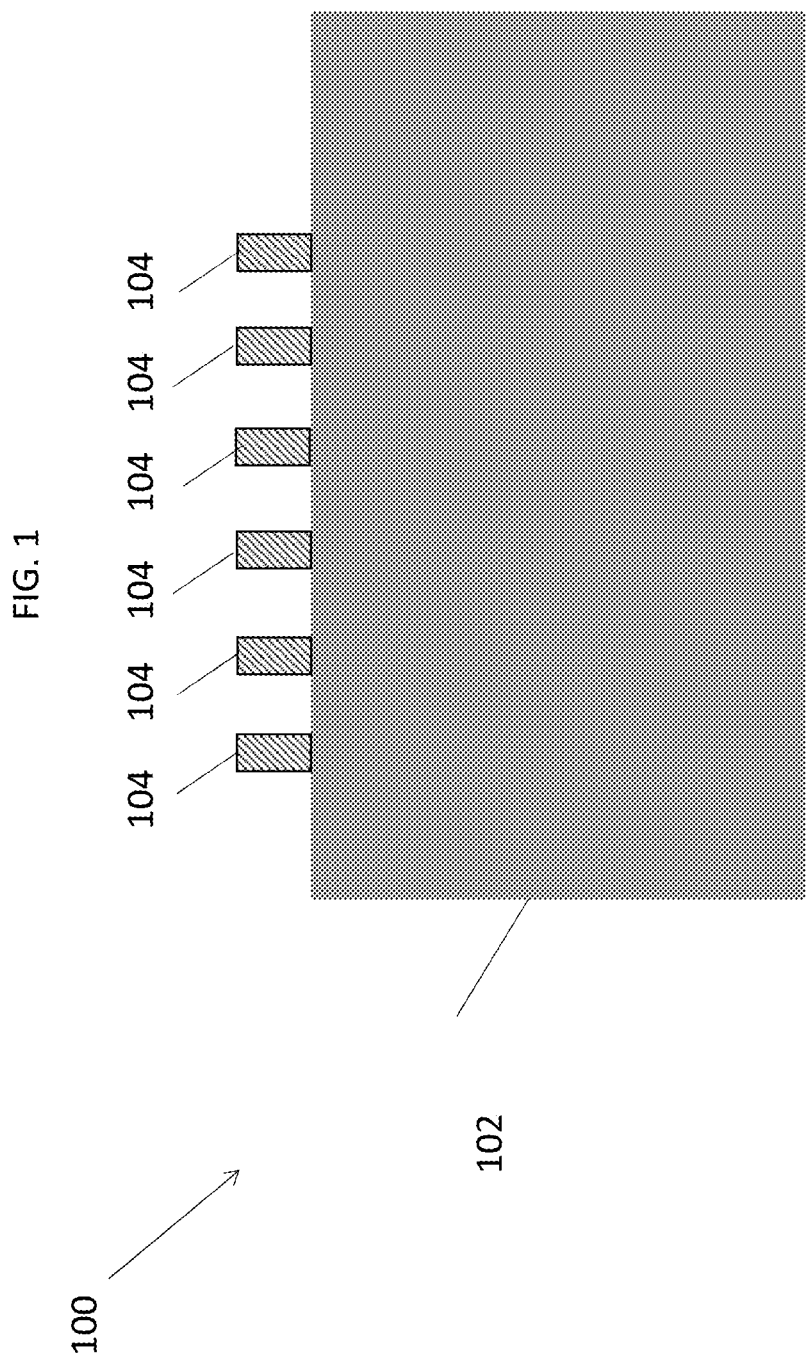
FIG. 1 depicts a side view of a structure from which fins for a finFET device will be formed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The terms "direct contact" or "directly contacting" mean that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of the present invention, embodiments described here allow the fabrication of finFET semiconductor structures with one group of one or more fins separated from another group of one or more fins such that epitaxy can be used in the different groups of fins without shorting the groups of fins together. FIG. 1 illustrates a cross-sectional view of a structure 100 having a substrate 102 during an intermediate operation of a method of fabricating a semiconductor device according to one or more embodiments. The substrate 102 can be of any suitable substrate material such as, for example, monocrystalline Si, SiGe, SiC, or semiconductor-on-insulator (SOI). In some embodiments, a top layer of the substrate 102 can be Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials.

In some embodiments, a hardmask layer is deposited on top of the substrate 102 and patterned such that discrete hardmasks 104 remain. The hardmasks can be of any suitable material, such as silicon nitride SiN and can be referred to herein as a fin hardmask from time to time. In more detail, the fins are formed by forming fin hardmasks 104 on top of a substrate 102 and then performing a reactive ion etching process on the substrate to remove portions of the substrate not covered by the fin hardmask layer 104. Because there is no stop layer on or in the substrate 102, the reactive ion etch process is time based.

Figure 2:
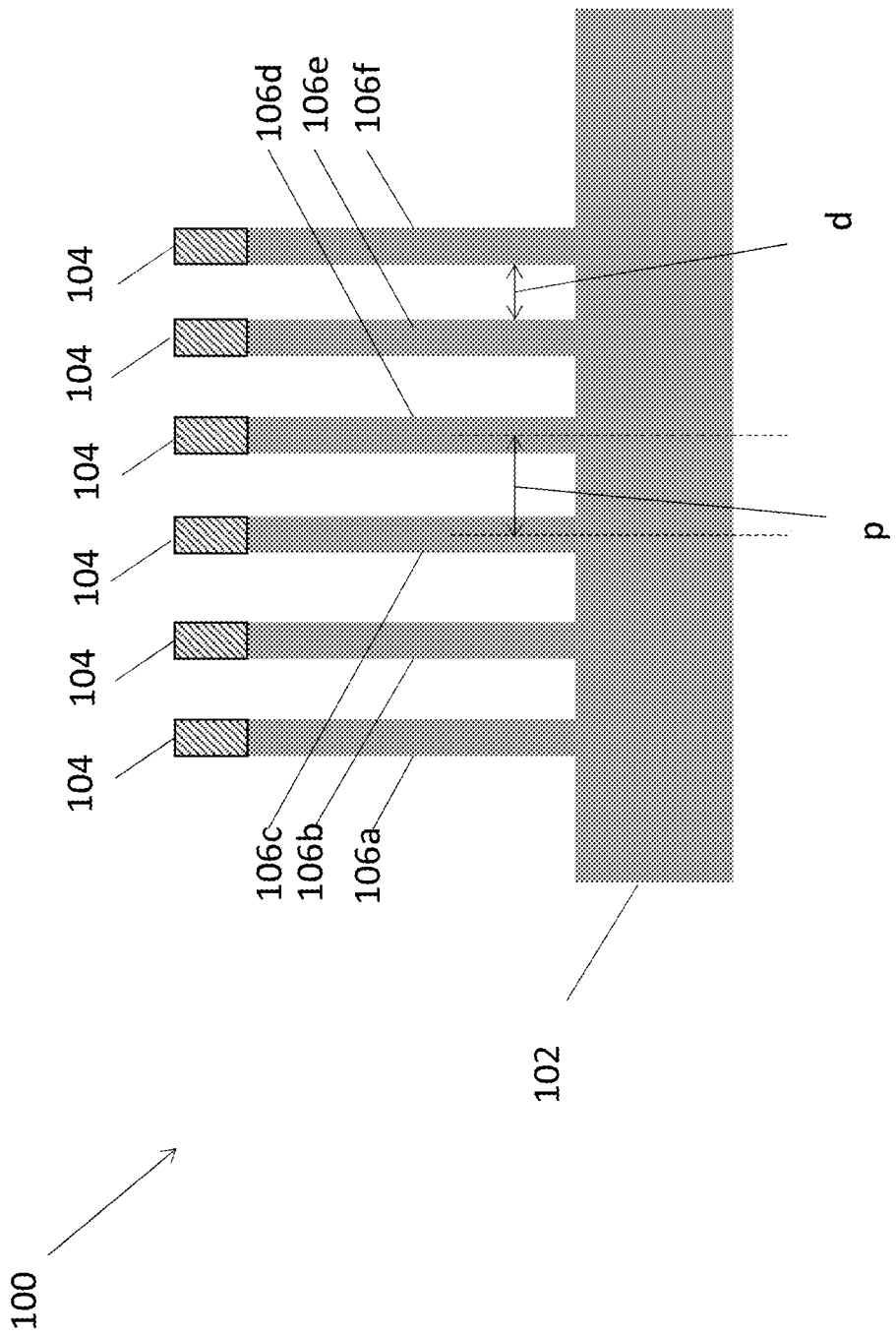
FIG. 2 shows side view of the structure of FIG. 1 after the fins have been formed from a substrate.

FIG. 2 illustrates a cross-sectional view of the structure 100 after the formation of fins 106a, 106b, 106c, 106d, 106e, 106f. The fins can be formed by lithography or etching. The lithography can be for example, self-aligned double patterning (SADP) or self-aligned quadruple patterning (SAQP). While identified as different elements, it shall be understood that the fins 106 are formed of the same material as the substrate 102.

The center of each fin 106a-106f is separated from the center of it nearest neighbor by a distance p or "fin pitch". Of course the distance p could be measured from one left edge of a fin to the left edge of its adjacent neighbor in some embodiments. For a particular fin pitch, a distance "d" exists between each adjacent fin. This distance d will define the width of liners formed on sides/tops of groups of fins as further described below.

As illustrated, the fins 106a-106f are formed of the same material as the substrate 102. Of course, in some embodiments, the fins 106a-106f or the substrate 102 could be doped such they are the same as one another.

Figure 3:
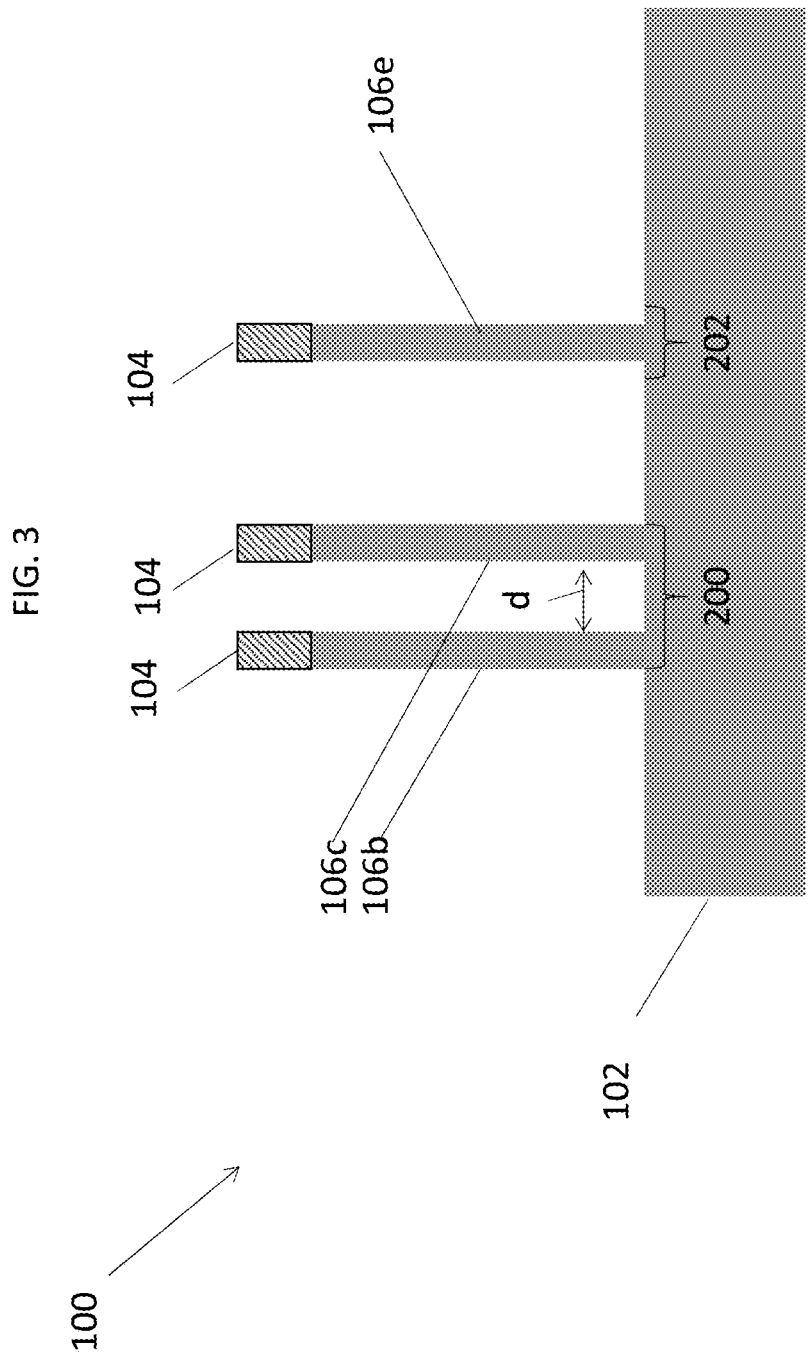
FIG. 3 shows a side view of the structure of FIG. 2 after some of the fins have been removed.

FIG. 3 shows an intermediate structure after one or more of the fins 106a-106f have been removed. In the example shown in FIG. 3, fins 106a, 106d and 106f have been removed. The fins 106b, 106c and 106e that remain will be used to form one or more FETs. In the example that follows, fins 106b and 106c can form an nFET (that will be referred to by reference numeral 200 herein) and a pFET (that will be referred to by reference numeral 202 herein). The combination of the nFET 200 and the pFET 202 can, in combination, form an SRAM. As such, in some embodiments, the process flow shown in the Figures is a process flow for forming an SRAM.

As illustrated and described herein, the nFET 200 will include two fins that will be used to form the source and drain of the nFET 200 and the pFET will include one fin on which sources and drains are epitaxially grown. Of course, the number of fins could be varied. In a further processing step, for the fins 106b and 106c of the nFET 200, as well as for the fin 106e of the pFET 202, the epitaxy on the fins will be diamond shaped. For the case where a particular FET includes two or more fins (e.g., nFET 200), the diamond shaped epitaxy on one fin can contact the diamond shaped epitaxy on the other fin(s). However, in the illustrated case, it is not desired that the epitaxy on the nFET 200 fins (106b, 106c) contact the epitaxy on the pFET 200 fin 106e. The following process flow provides for the incorporation of a spacer that prevents such contact. The spacer can be formed of an oxide material that functions as a shallow trench isolation (STI) region.

Figure 4:
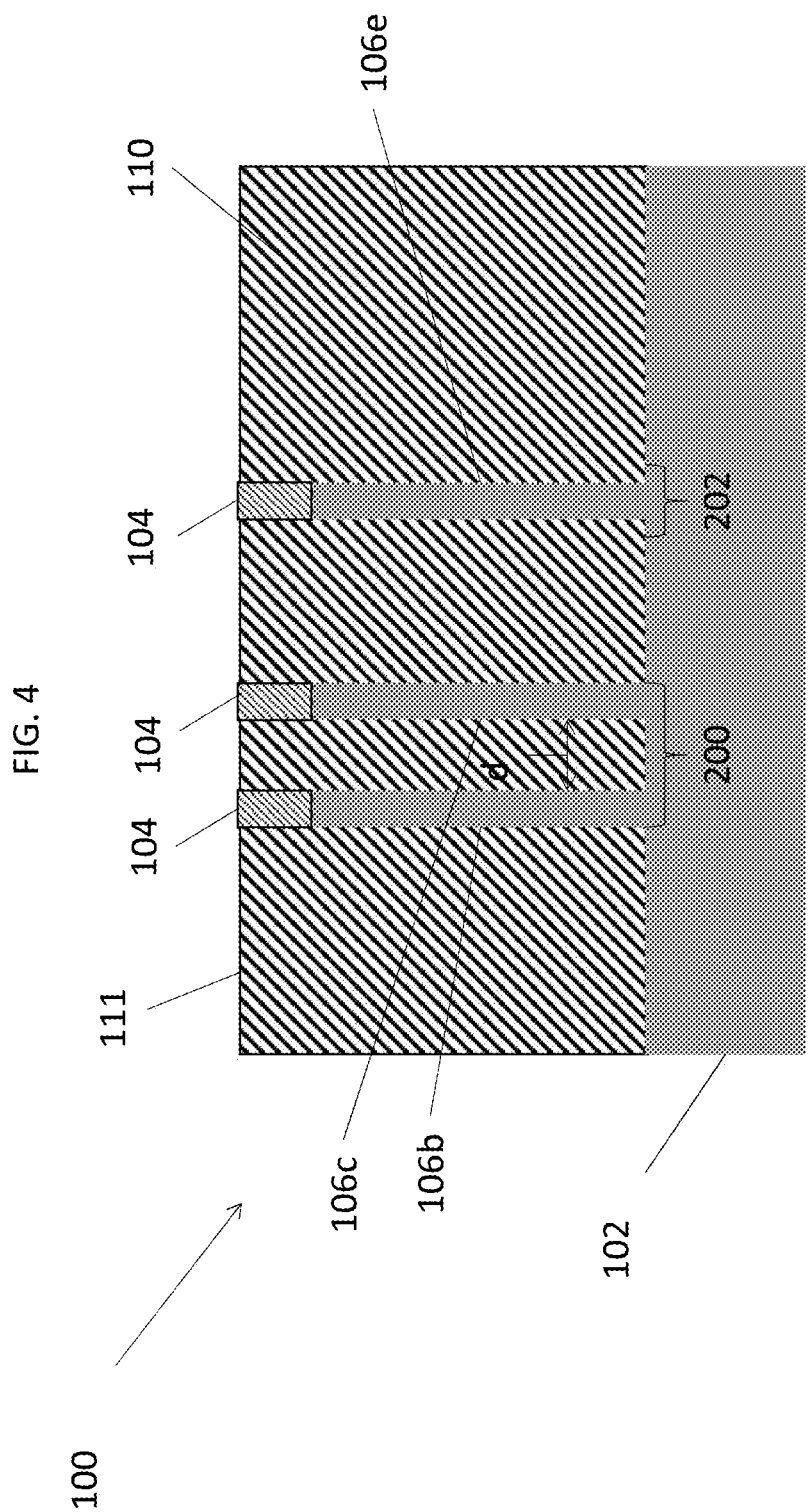
FIG. 4 shows a side view of the structure of FIG. 3 after spaces between the fins have been filled by a shallow trench isolator (STI) and chemical-mechanical processing (CMP) has been performed.

FIG. 4 shows the structure 100 after an oxide STI 110 is deposited over the substrate 102 and between the remaining fins 106. The STI 110 can include a top surface 111 and can be at the same height as the tops of the hardmask layer 104. This leveling can occur due to subjecting the oxide 110 to a CMP process.

Figure 5:
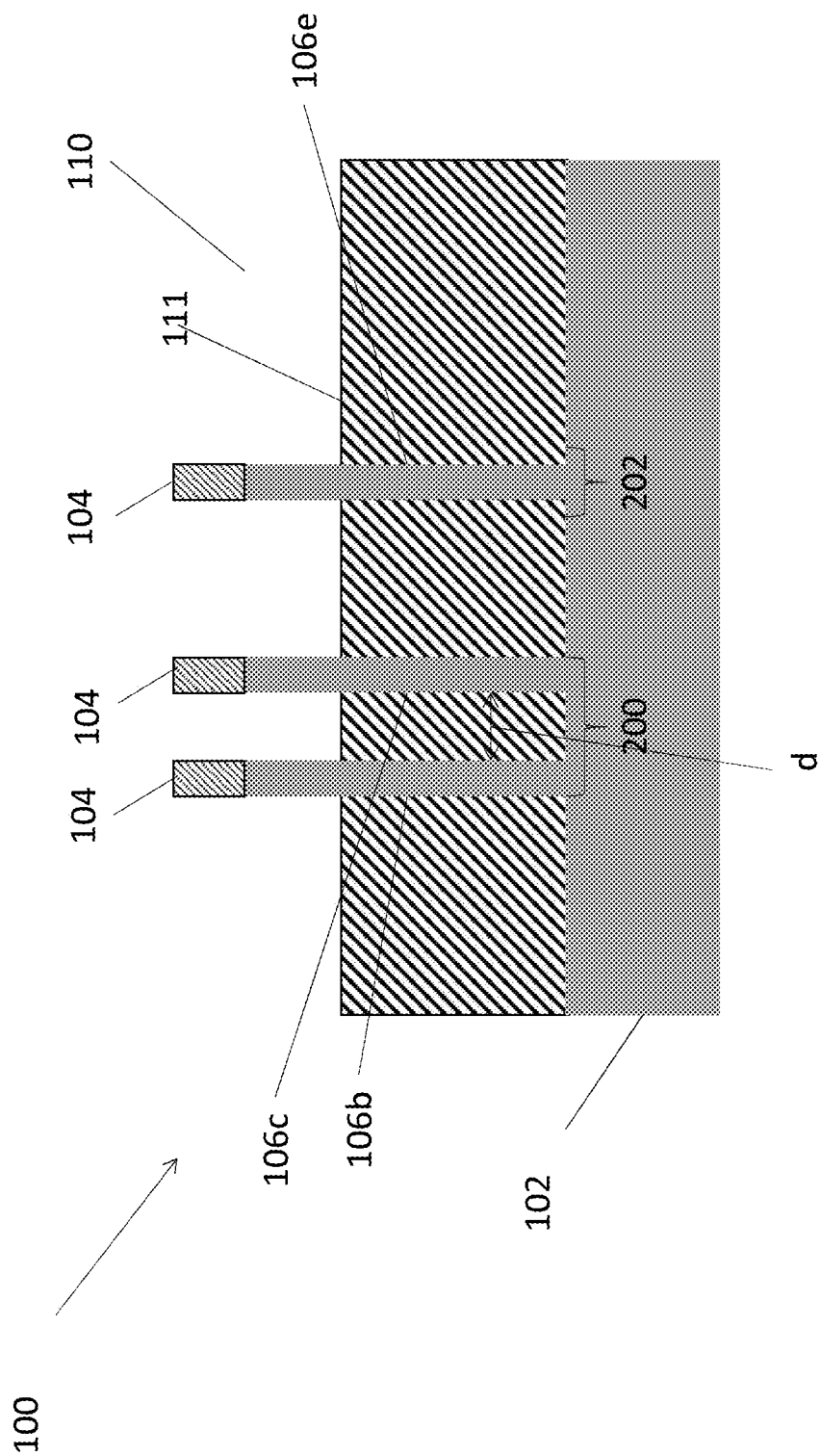
FIG. 5 shows a side view of the structure of FIG. 4 after the top of the STI has been lowered to reveal the fins.

FIG. 5 shows the structure 100 after the top surface 111 of the oxide has been lowered (e.g., polished back) to reveal the top portions of the fins 106b, 106c, 106e. The removal of the oxide 110 can be accomplished by either a wet or dry etch. As illustrated, the SiN hardmask 104 remains on the top of the fins. It shall be understood the hardmask 104 could be removed in some embodiments.

Figure 6:
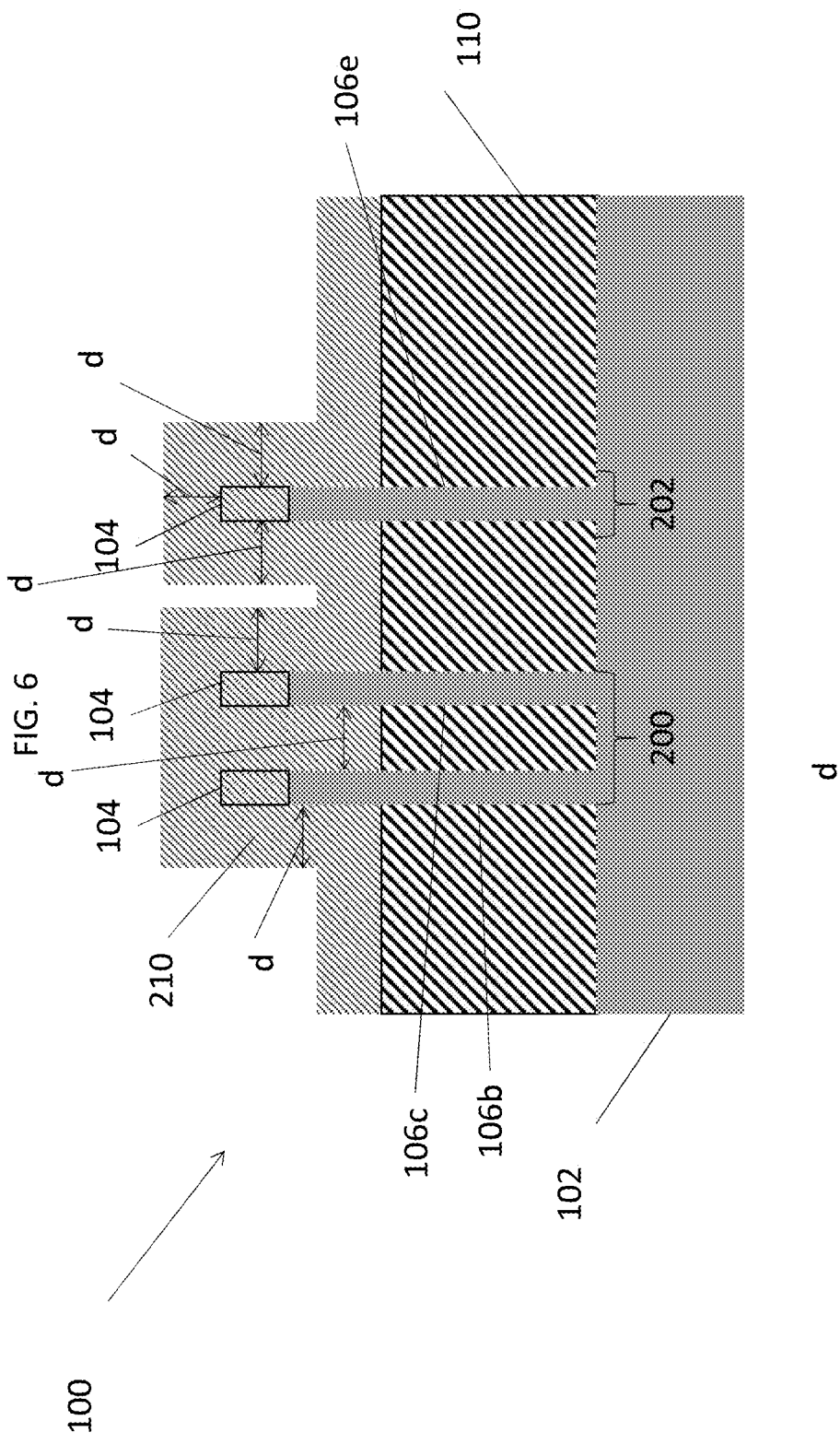
FIG. 6 shows a side view of a structure of FIG. 5 after a hardmask layer has been formed over the STI and the exposed fins.

Next, and as shown in FIG. 6, a hardmask layer 210 is deposited over oxide layer 110 and the fins 106b, 106c, 106e. As shown, the hardmask layer 210 is the same material as hardmask 104 (e.g., SiN). The hardmask layer 210 is deposited such that it has a thickness equal to the distance d between adjacent fins 106b, 106c. As such, the hardmask layer 210 forms a solid pinch off between the fins 106b and 106c of the nFET 200. Because fin 106d was removed, the thickness of the hardmask layer 210 deposited on the adjacent sides of fins 106c and 106e will result in the formation of a trough 212 (FIG. 7) between them. This trough will lead to the formation of the oxide separator that separates the fins of the nFET 200 from the fin of the pFET 202.

Figure 7:
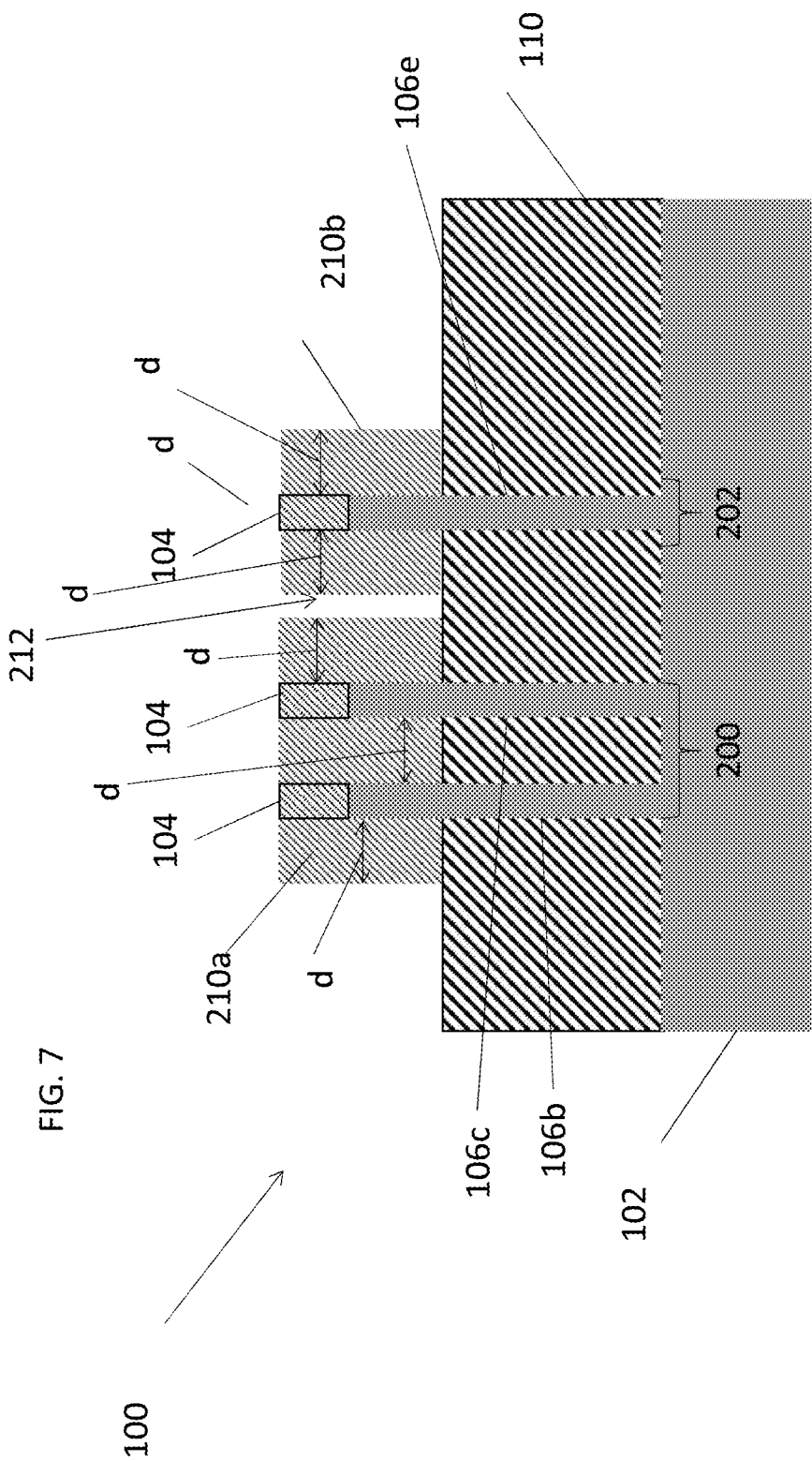
FIG. 7 shows a side view of the structure of FIG. 6 after portions of the hardmask layer that are further from the fins than the distance between the fins have been removed to form first and second hardmask blocks.

FIG. 7 shows the structure 100 after portions of the hardmask layer 210 that are further from the fins than the distance d have been removed. As illustrated, the nFET includes a first hardmask block 210a surrounding top portions of the fins 106b, 106c, and the pFET includes a second hardmask block 210b surrounding top portions of the fin 106e. Such removal can be done by wet etching.

Figure 8:
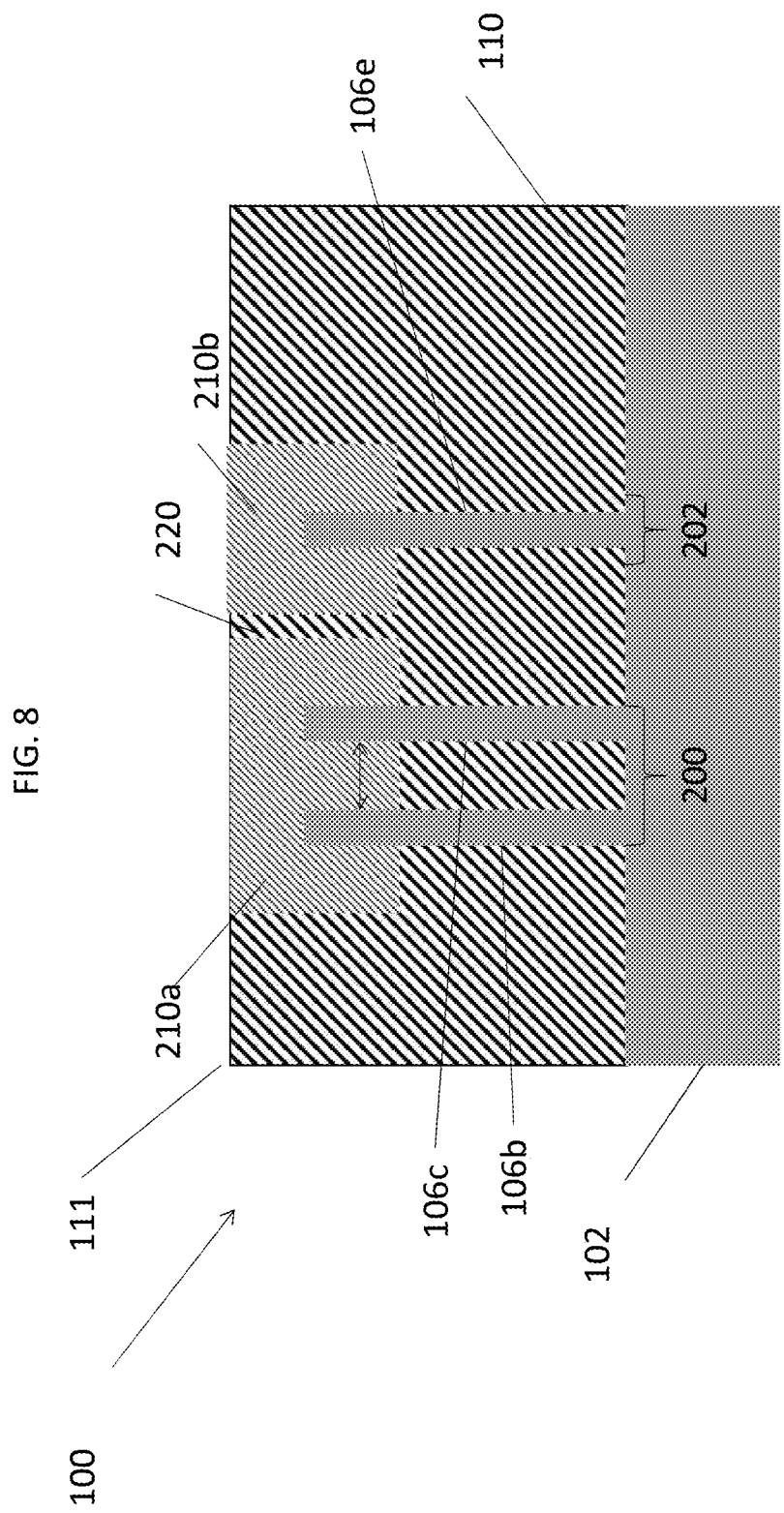
FIG. 8 shows a side view of the structure of FIG. 7 after an STI refill has been performed.

As illustrated in FIG. 8, more oxide is added to the oxide layer 110 to bring its top 111 to the top or near the top of the first hardmask block 210a and the second hardmask block 210b. The oxide fill step results in the formation of the oxide barrier 220 between the first (or nFET) hardmask block 210a and the second (or pFET) hardmask block 210b. The barrier 220 will serve to isolate the epitaxy on the nFET fins 106b, 106c from the epitaxy on the pFET fin 106e. This allows for the formation of smaller SRAM devices in some instances.

Figure 9:
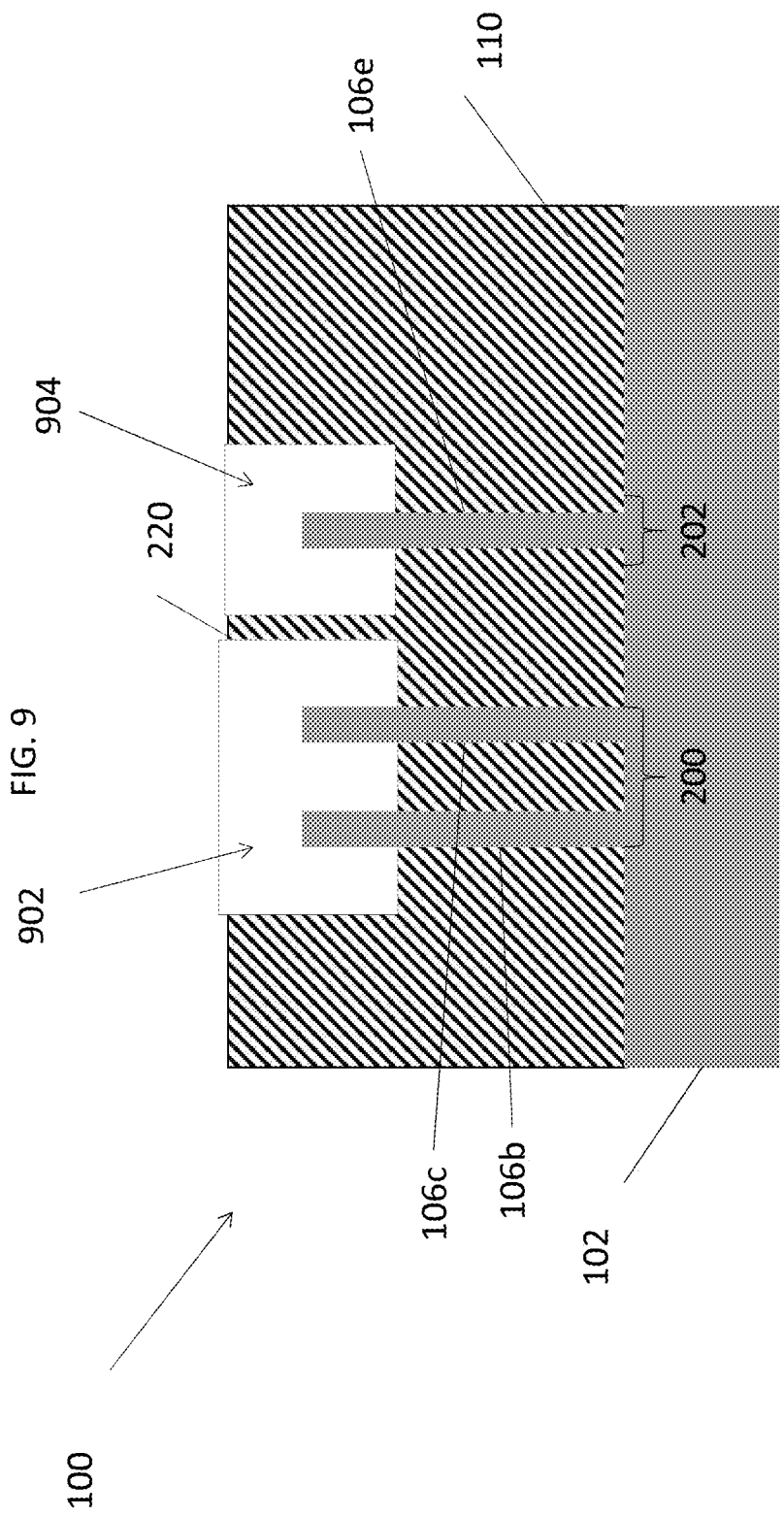
FIG. 9 shows a side view of the structure of FIG. 8 after the first hardmask blocks have been removed.

FIG. 9 shows the structure 100 after the first hardmask block 210a and the second hardmask block 210b have been removed. Such removal can be performed by a wet etch in one embodiment. The removal of the blocks 210a, 210b results in first and second epi wells 902, 904 in which source/drain regions can be grown by epitaxy. These wells 902, 904 are separated by barrier 220 such that fins for one device (e.g., nFET 200) are not shorted to fins for another device (e.g., pFET 202).

Figure 10:
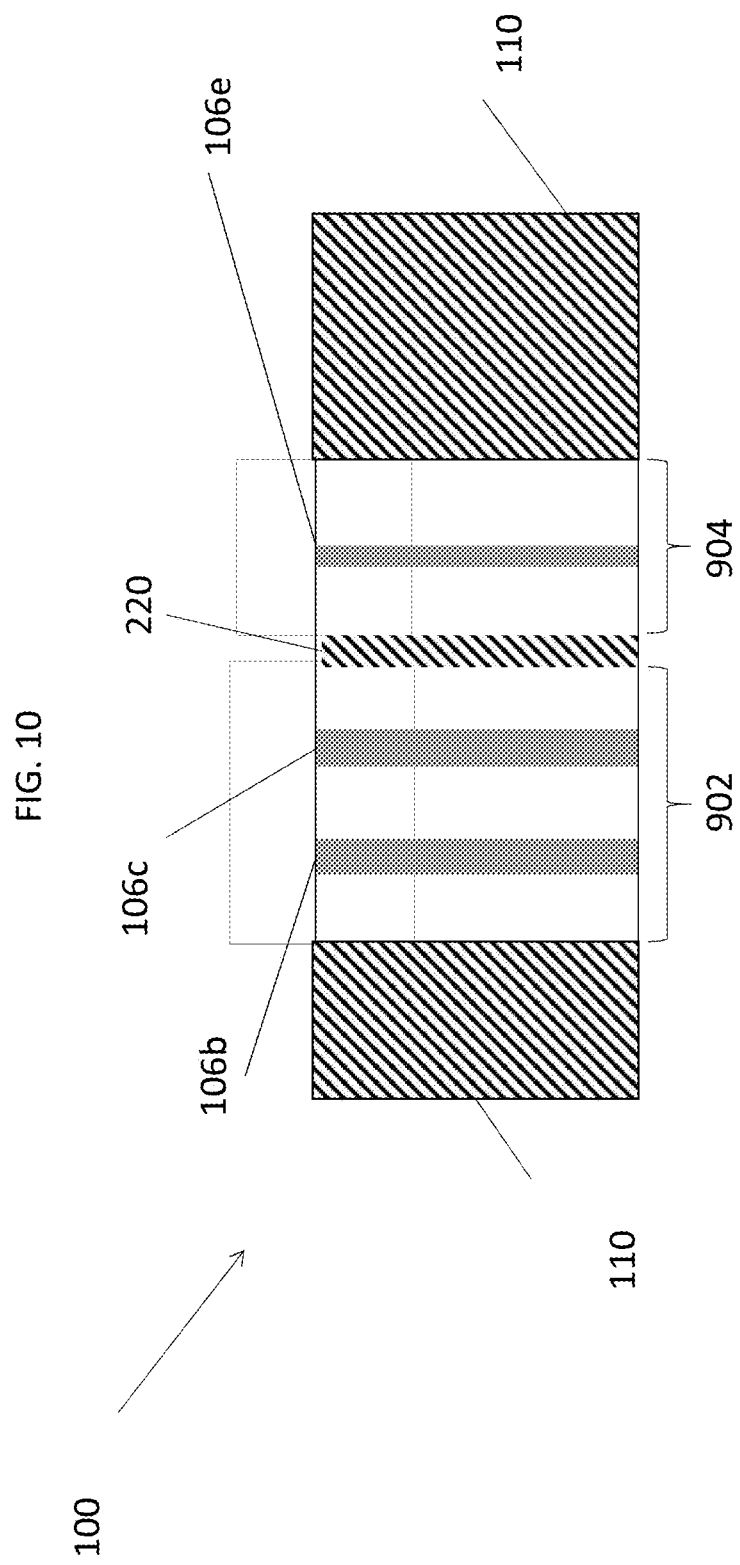
FIG. 10 is a top view of structure of FIG. 9.

FIG. 10 is top view of the structure 100 of FIG. 9. From this view, the epi wells 902 and 904 are clearly visible. At this stage, a gate stack can be created to form a gate that divides the fins 10bb, 106c and 106e into source and drain sides on either side. The formation of gates is well known and only briefly discussed herein.

Figure 11:
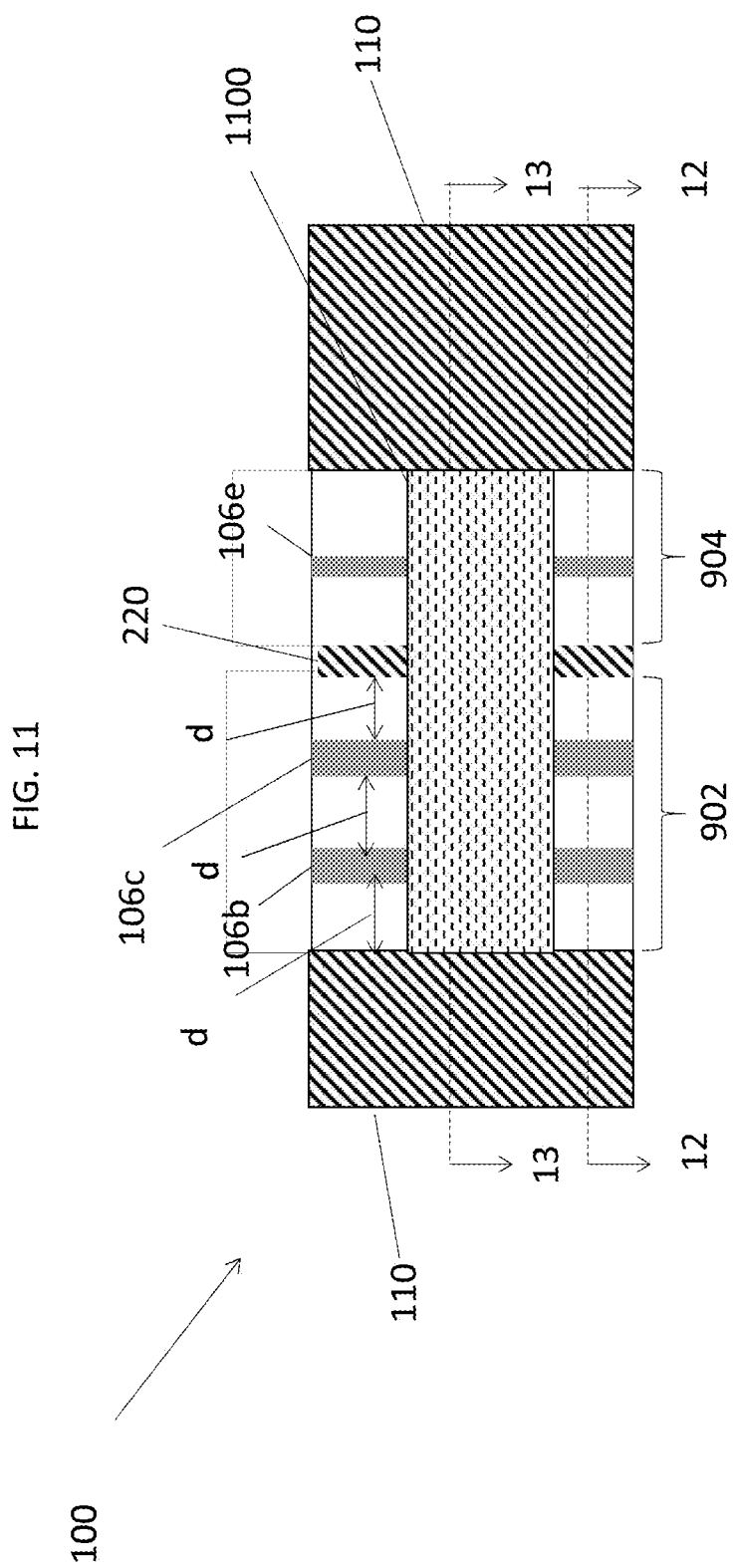
FIG. 11 is a top view of structure of FIG. 9 after a portion of the gate has been formed thereon.

As shown in FIG. 11, one step of the formation of a gate can include deposition of a work function metal layer 1100 over the fins 106b, 106c, 106e. Of course, other layers can be deposited between the fins 106b, 106c, 106e and the work function metal layer 1100.

Figure 13:
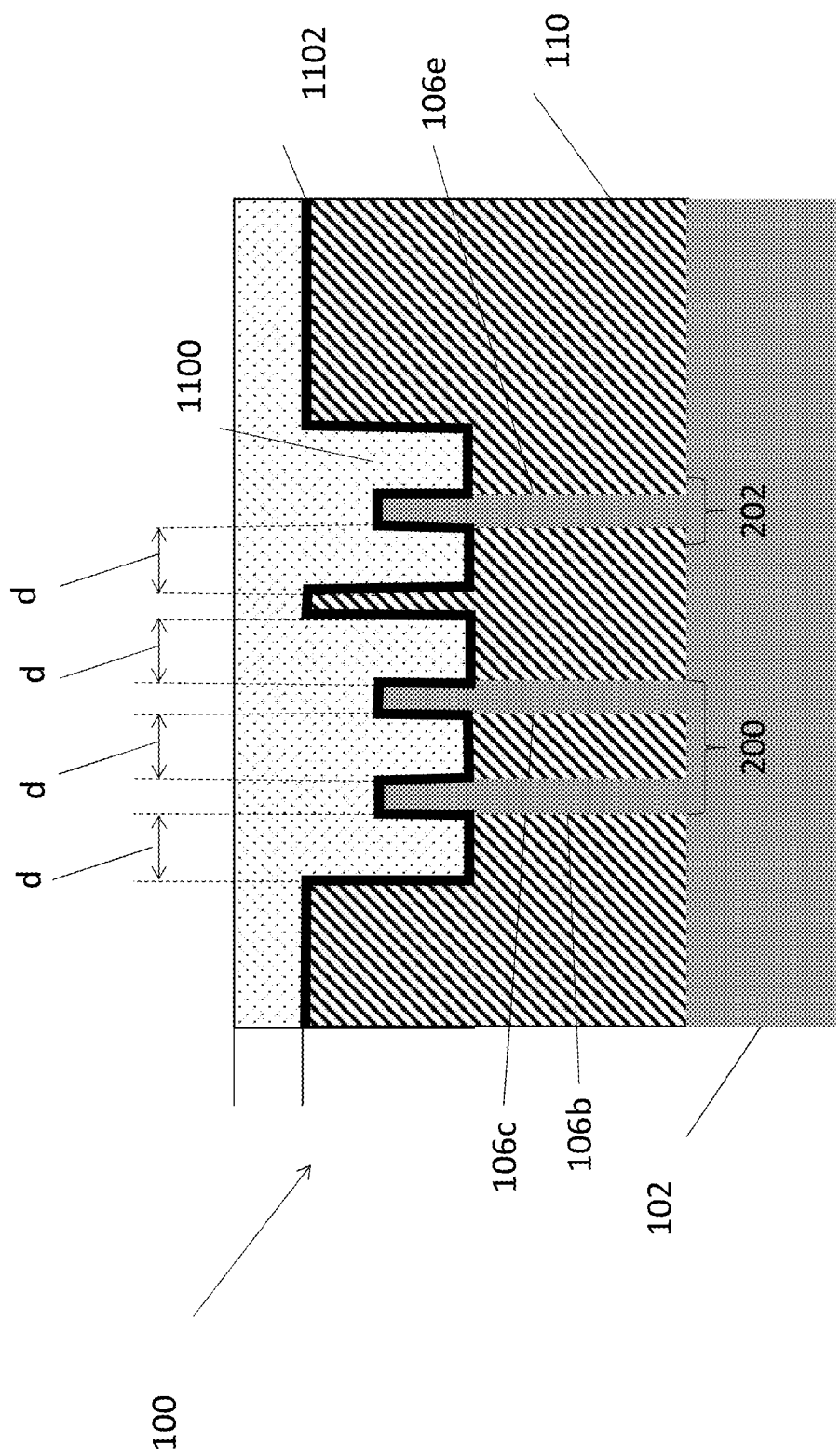
FIG. 13 shows a cross section taken along line 13-13 of the structure of FIG. 11.

With reference to FIG. 13, in some embodiments, the work function metal layer 1100 is disposed over a high-k dielectric layer 1102 directly deposited over the oxide layer 110. The work function metal layer 1100 is of a uniform thickness on the sides of the fins 106b, 106c because the distance d between them is the same as the distance between an outer edge of them and the adjacent portion of the oxide layer 110 (including barrier 220). In this manner, each sidewall will have symmetric and the same work function metal 1100 disposed thereon.

Figure 12:
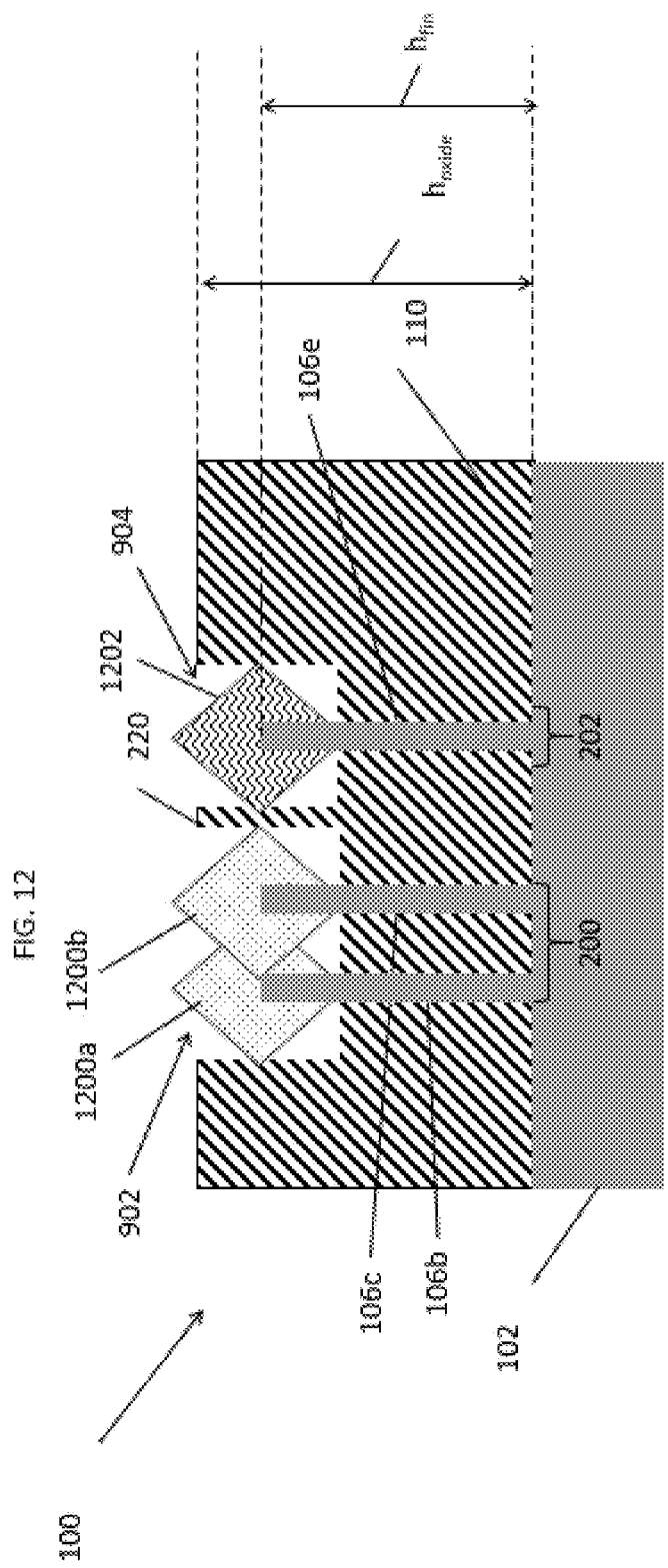
FIG. 12 shows a cross section taken along line 12-12 of the structure of FIG. 11.

FIG. 12 shows a cross section taken along line 12-12 of FIG. 11. After the gate 260 (shown in FIG. 14) is completed and spacers 262 (shown in FIG. 14) formed on its sides, n-type diamond shaped epitaxially grown contacts 1200a, 1200b are grown on the fins 106b, 106c of the nFET 200. During this process, the second epi well 904 can be covered. The barrier 220 keeps the contact 1200b from reaching or otherwise electrically contacting fin 106e of the pFET 202. Similarly, after the gate 260 is completed and spacers 262 formed on its sides (FIG. 13), p-type diamond shaped epitaxially grown contact 1202, are grown on the fin 106e of the pFET 202. During this process, the first epi well 902 can be covered. The barrier 220 keeps the contact 1200e from reaching or otherwise electrically contacting fin 106b of the nFET 202.

As described above but as also shown in FIG. 12, the height of the oxide (hoxide) is greater than the height of the fins (hfin). In this case, the heights hoxide and hfin are measured from a top of the substrate 102.

Figure 14:
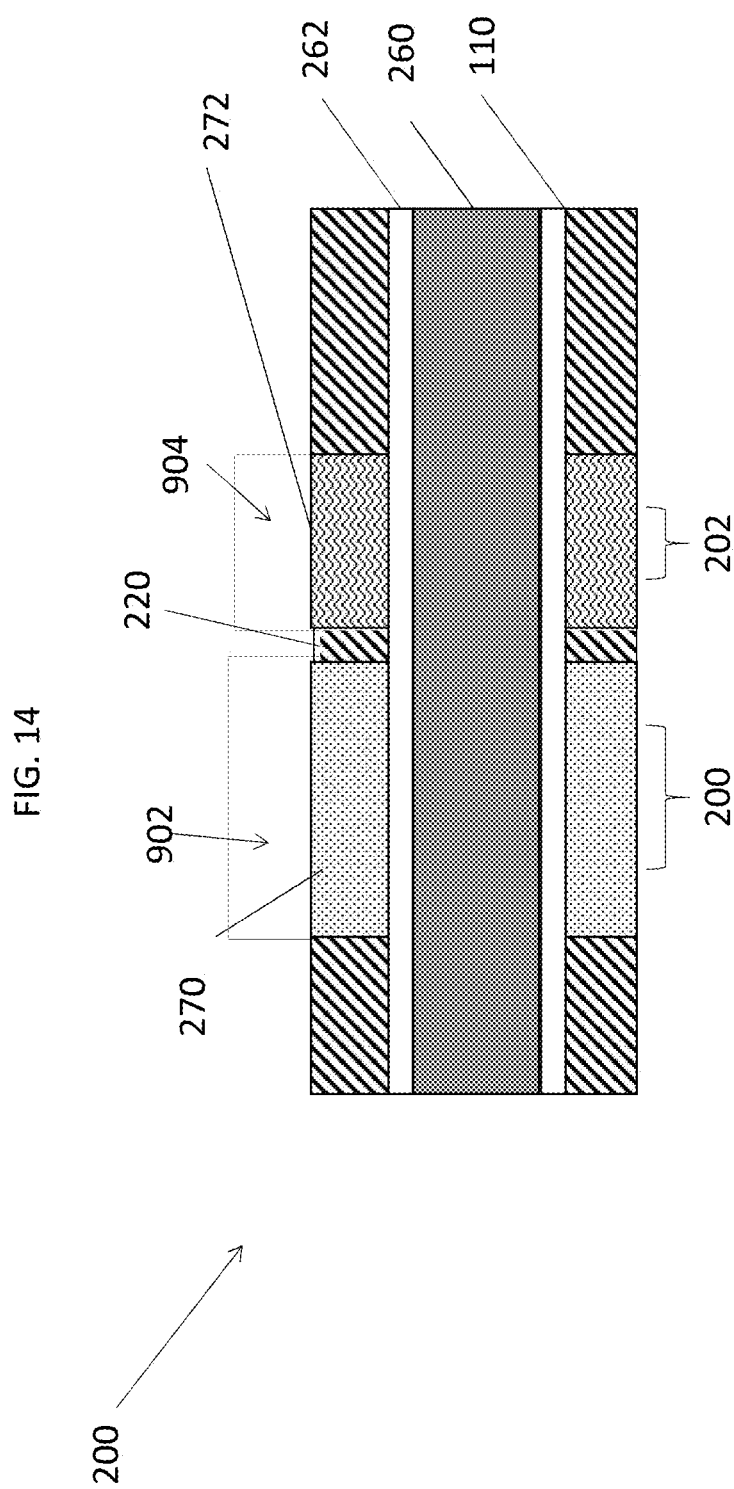
FIG. 14 is top view of structure having completed gate and epitaxially grown source and drain regions.

In FIG. 14, the spacer 262 separates the gate 260 from the contacts 1200 and 1202. The spacer 262 can be formed by reactive ion etching (RIE) and formed from SiN. Of course, other methods and materials can be used. The remaining space in the first and second epi wells 902, 904 not filled by the source and drain can be filled by an interlayer dielectric (ILD) fill process to form source and drain regions 270, 272, respectively.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device including an nFET device and pFET device adjacent one another, the semiconductor device including:
    a shallow trench isolator (STI);
    a gate;
    a substrate having fins extending upwardly through and contacting the STI, the fins including:
    nFET fins extending outwardly from opposing sides of the gate and disposed in an nFET epi well formed in the STI, a top of the STI being above a top of the nFET fins; and
    pFET fins extending outwardly from opposing sides of the gate and disposed in a pFET epi well formed in the STI, the top of the STI being above a top of the pFET fins, wherein the pFET epi well is separated from the nFET epi well by a barrier formed by a portion of the STI; and
    nFET source contacts on each nFET fin of the nFET fins, each nFET source contact on each nFET fin being in physical contact with an nFET source contact of an adjacent nFET fin;
    wherein each nFET fin is a fin distance d away from an adjacent nFET fin; and wherein the barrier is the fin distance d away from a nearest nFET fin of the nFET fins and a nearest pFET fin of the pFET fins.

2. The semiconductor device of claim 1, further comprising:
    a pFET source contact on each pFET fin, the pFET source contact being separated from the nFET source contacts by the barrier formed by the portion of the STI.

3. The semiconductor device of claim 2, wherein the nFET and pFET source contacts are diamond-shaped contacts.

4. The semiconductor device of claim 3, wherein the nFET and pFET source contacts are epitaxially grown.

5. The semiconductor device of claim 1, wherein the top of the STI is higher than the top of the nFET fins and the top of the pFET fins.

6. The semiconductor device of claim 1, wherein each pFET fin is at least the fin distance d away from walls of the pFET epi well.

7. The semiconductor device of claim 1, wherein the nFET fins include two or more fins.

8. A semiconductor device including an nFET device and pFET device adjacent one another, the semiconductor device including:
- a shallow trench isolator (STI);
- a gate;
- a substrate having fins extending upwardly through and contacting the STI, the fins including:
- nFET fins extending outwardly from opposing sides of the gate and disposed in an nFET epi well formed in the STI, a top of the STI being above a top of the nFET fins; and
- a pFET fin extending outwardly from opposing sides of the gate and disposed in a pFET epi well formed in the STI, the top of the STI being above a top of the pFET fin, wherein the pFET epi well is separated from the nFET epi well by a barrier formed by a portion of the STI; and
- nFET source contacts on each nFET fin of the nFET fins, each nFET source contact on each nFET fin being in physical contact with an nFET source contact of an adjacent nFET fin;
- wherein the nFET fins are a fin distance d away from each other and the pFET fin is the fin distance d from all walls of the pFET epi well.

9. The semiconductor device of claim 8, further comprising:
- a pFET source contact on the pFET fin, the pFET source contact being separated from the nFET source contacts by the barrier formed by the STI.

10. The semiconductor device of claim 9, wherein the nFET and pFET source contacts are diamond-shaped contacts.

11. The semiconductor device of claim 10, wherein the nFET and pFET source contacts are epitaxially grown.

12. The semiconductor device of claim 11, wherein the nFET source contacts are formed at least partially between nFET fins.

13. The semiconductor device of claim 12, wherein the nFET source contacts are also formed between the nFET fins and the STI.

14. The semiconductor device of claim 8, wherein the top of the STI is higher than the top of the nFET fins and the pFET fin.

15. The semiconductor device of claim 8, wherein each nFET fin is at least the fin distance d away from walls of the nFET epi well.

16. The semiconductor device of claim 8, wherein the nFET fins include two or more fins.

* * * * *